(12) United States Patent
Park et al.

(10) Patent No.: US 10,863,627 B1
(45) Date of Patent: Dec. 8, 2020

(54) ELECTRONIC COMPONENT EMBEDDED SUBSTRATE

(71) Applicant: SAMSUNG ELECTRO-MECHANICS CO., LTD., Suwon-si (KR)

(72) Inventors: Je Sang Park, Suwon-si (KR); Sang Ho Jeong, Suwon-si (KR); Chang Yul Oh, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/671,623

(22) Filed: Nov. 1, 2019

(30) Foreign Application Priority Data

Aug. 23, 2019 (KR) .................. 10-2019-0103622

(51) Int. Cl.
*H05K 1/18* (2006.01)
*H05K 1/11* (2006.01)

(52) U.S. Cl.
CPC ............. *H05K 1/188* (2013.01); *H05K 1/115* (2013.01)

(58) Field of Classification Search
CPC ........ H05K 1/185; H05K 1/115; H05K 1/182; H05K 1/184; H05K 1/183; H05K 1/188
See application file for complete search history.

(56) References Cited

U.S. PATENT DOCUMENTS

2007/0076392 A1* 4/2007 Urashima ................ H01G 2/06
361/763
2009/0310323 A1* 12/2009 Baek .................. H01L 23/5389
361/784

FOREIGN PATENT DOCUMENTS

JP         5955023 B2     7/2016
KR  10-2009-0130727 A   12/2009

* cited by examiner

*Primary Examiner* — Timothy J Thompson
*Assistant Examiner* — Amol H Patel
(74) *Attorney, Agent, or Firm* — Morgan, Lewis & Bockius LLP

(57) ABSTRACT

An electronic component-embedded substrate of the present disclosure includes a core structure including an insulating layer, a first wiring layer disposed on an upper surface of the insulating layer and a through-portion passing through the insulating layer; a first electronic component disposed in the through-portion and including a connection electrode; an insulator disposed in a portion of the through-portion between the core structure and a portion of the first electronic component; and a first metal layer disposed on an upper surface of the insulator. At least a portion of the first metal layer is included on the first wiring layer and physically in contact with at least a portion of the connection electrode.

17 Claims, 9 Drawing Sheets

ELECTRONIC COMPONENT EMBEDDED SUBSTRATE

CROSS-REFERENCE TO RELATED APPLICATION(S)

This application claims benefit of priority to Korean Patent Application No. 10-2019-0103622 filed on Aug. 23, 2019, in the Korean Intellectual Property Office, the disclosure of which are incorporated herein by references in its entirety.

TECHNICAL FIELD

The present disclosure relates to an electronic component embedded-substrate.

BACKGROUND

Generally, an electronic component-embedded substrate has a structure in which an electronic component is embedded to electrically connect the electronic component and a wiring layer electrically communicate through a via. Accordingly, there may be an issue with regard to the electronic component being embedded, in that a thickness of the substrate is becoming greater than that of electronic components.

SUMMARY

An aspect of the present disclosure is to provide an electronic component-embedded substrate which can be slimmed, in spite of including an electronic component embedded therein.

For example, an electronic component-embedded substrate according to an example of the present disclosure may include a core structure including an insulating layer, a first wiring layer disposed on an upper surface of the insulating layer and a through-portion passing through the insulating layer; a first electronic component disposed in the through-portion and including a connection electrode; an insulator disposed in a portion of the through-portion between the core structure and a portion of the first electronic component; and a first metal layer disposed on an upper surface of the insulator. At least a portion of the first metal layer is included on the first wiring layer and is physically in contact with at least a portion of the connection electrode.

Alternatively, an electronic component-embedded substrate according to an example of the present disclosure may include an insulating layer having a through-portion covered by a first wiring layer disposed on an upper side of the insulating layer; an electronic component disposed in the through-portion and comprising a connection electrode; an insulator disposed in at least a portion of the through-portion between at least a portion of the electronic component and the insulating layer; and a first metal layer disposed on an upper surface of the insulator and connecting the first wiring layer and at least a portion of the connection electrode to each other. A thickness of the first wiring layer is greater than a thickness of the first metal layer.

Alternatively, an electronic component-embedded substrate according to an example of the present disclosure may include an insulating layer having a through-portion passing through the insulating layer; an electronic component disposed in the through-portion; an insulator disposed in a portion of the through-portion between the insulating layer and the first electronic component; a first metal layer disposed directly on an upper surface of the insulator and an upper surface of a first electrode portion of the electronic component; and a second metal layer disposed directly on a lower surface of the insulator and a lower surface of a second electrode portion of the electronic component. The insulating layer is disposed between the first and second metal layers.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
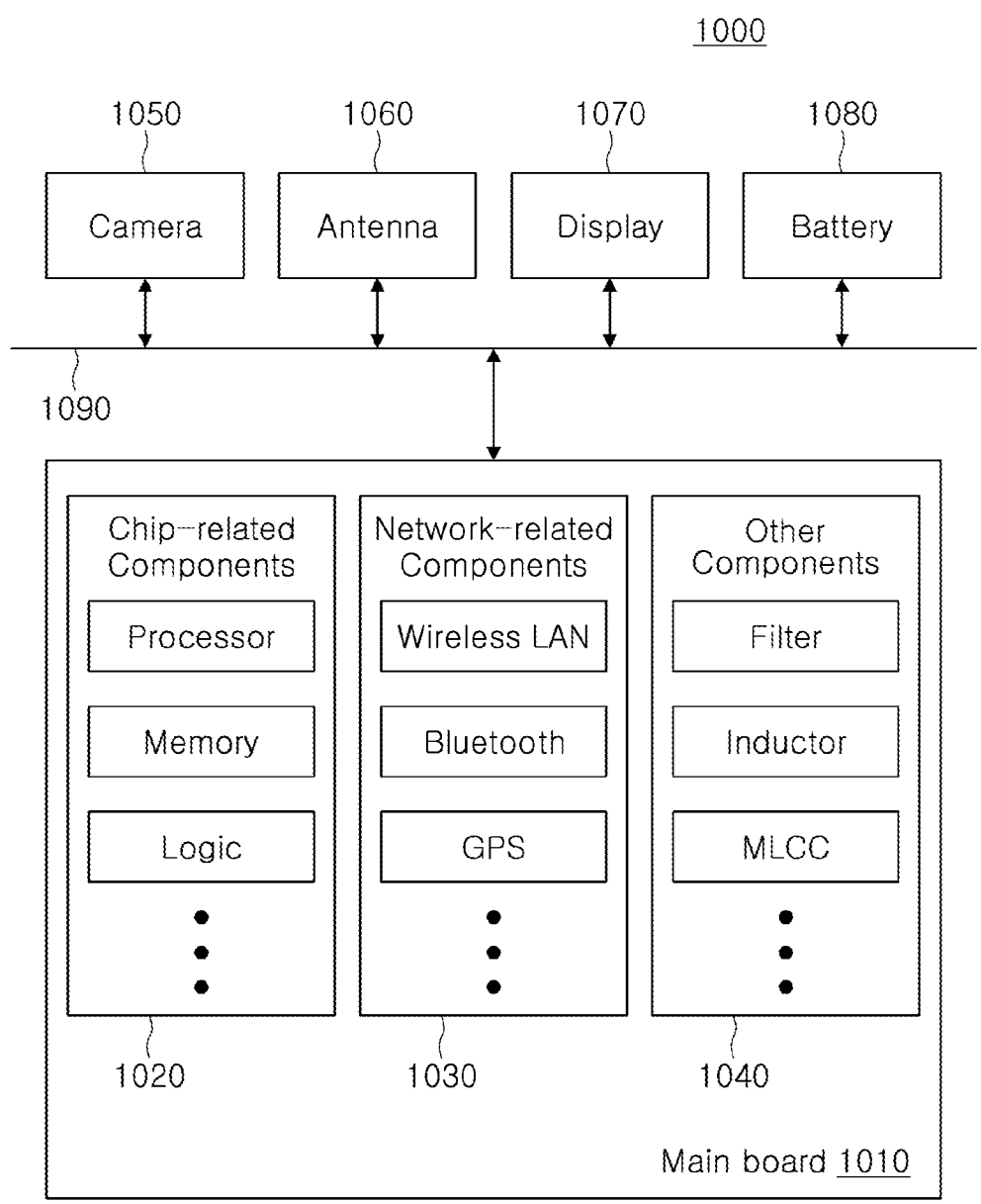
FIG. 1 is a schematic block diagram illustrating an example of an electronic device system.

FIG. 1 is a schematic block diagram illustrating an example of an electronic device system.

Referring to FIG. 1, an electronic device 1000 accommodates a motherboard 1010 (e.g., a main board) therein. The motherboard 1010 includes chip-related components 1020, network-related components 1030, other components 1040, and the like, physically and/or electrically connected thereto.

These components are connected to other electronic components to be described later to form various signal lines 1090.

The chip-related components 1020 may include a memory chip such as a volatile memory (e.g., a dynamic random access memory (DRAM)), a non-volatile memory (e.g., a read-only memory (ROM)), a flash memory, or the like; an application processor chip such as a central processor (e.g., a central processing unit (CPU)), a graphics processor (e.g., a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like, but are not limited thereto. The chip-related components 1020 may also include other types of chip-related components. In addition, the chip-related components 1020 may be combined with each other. The chip-related components 1020 may be in a package form in which the previously described chips or electronic components are included.

The network-related components 1030 may include wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols, but are not limited thereto. The network-related components 1030 may also include a variety of any other wireless or wired standards or protocols. In addition, the network-related components 1030 may be combined with the chip-related components 1020 described above.

Other components 1040 may include a high-frequency inductor, a ferrite inductor, a power inductor, ferrite beads, a low temperature co-fired ceramic (LTCC), an electromagnetic interference (EMI) filter, a multilayer ceramic capacitor (MLCC), or the like, but are not limited thereto. The other components 1040 may also include passive components in the chip-component shape, or the like, used for various other purposes. In addition, the other components 1040 may be combined with the chip-related components 1020 and/or the network-related components 1030 described above.

Depending on a type of thereof, the electronic device 1000 may include other components that may or may not be physically and/or electrically connected to the motherboard 1010. These other components may include, for example, a camera module 1050, an antenna module 1060, a display 1070, a battery 1080, or the like, but are not limited thereto. These other components may also include an audio codec, a video codec, a power amplifier, a compass, an accelerometer, a gyroscope, a speaker, a mass storage unit (e.g., a hard disk drive), a compact disk (CD) drive, a digital versatile disk (DVD) drive, or the like. In addition, other components, or the like, used for various purposes may be included depending on a type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive, or the like, but is not limited thereto. The electronic device 1000 may be any other electronic device processing data.

Figure 2:
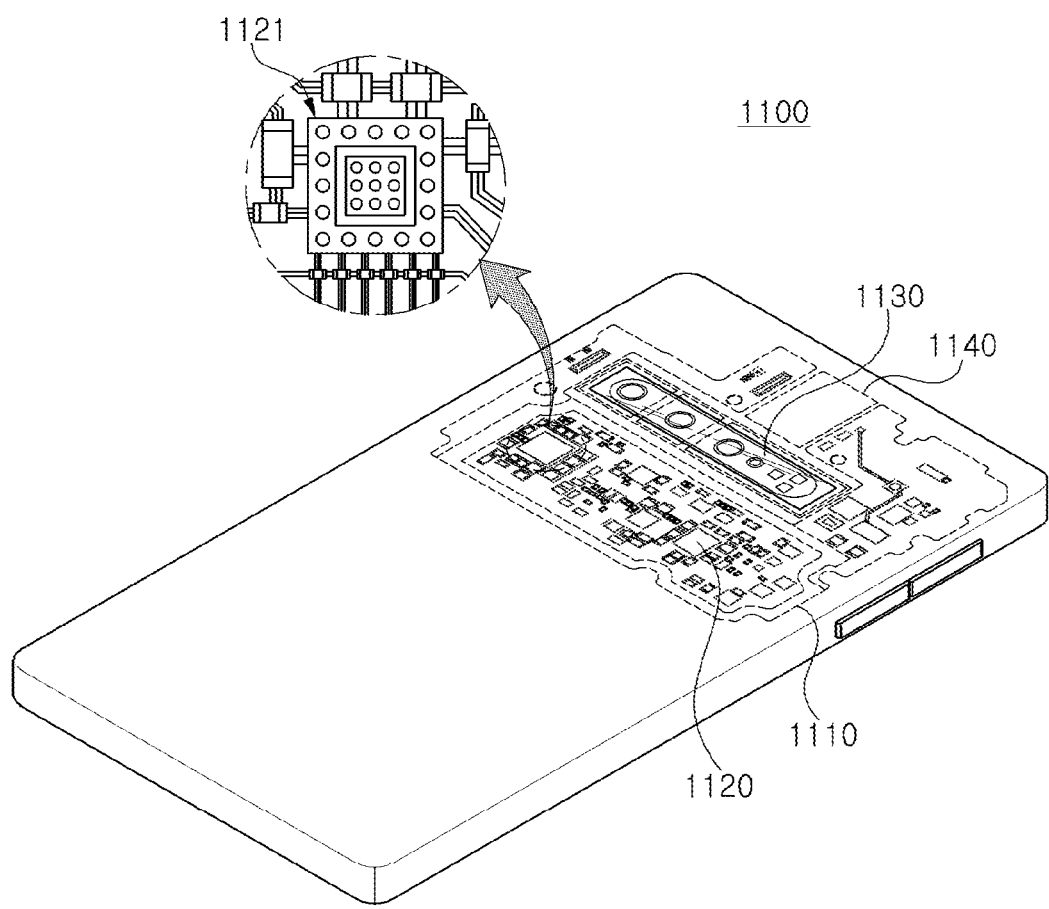
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 is accommodated inside the smartphone 1100, and various electronic components 1120 are physically and/or electrically connected to the motherboard 1110. In addition, other components which may or may not be physically and/or electrically connected to the motherboard 1110, such as a camera module 1130 and/or a speaker 1140, may be accommodated in the motherboard 1110. Some of the electronic components 1120 may be the previously described chip-related components, and may be, for example, a semiconductor package 1121, but is not limited thereto. The semiconductor package 1121 may be in the form in which semiconductor chip or a passive component is mounted on a surface of the package substrate having an electronic component-embedded substrate shape, but is not limited thereto. Meanwhile, the electronic device is not necessarily limited to the smartphone 1100, but may be other electronic devices as previously described.

Electronic Component-Embedded Substrate

Figure 3:
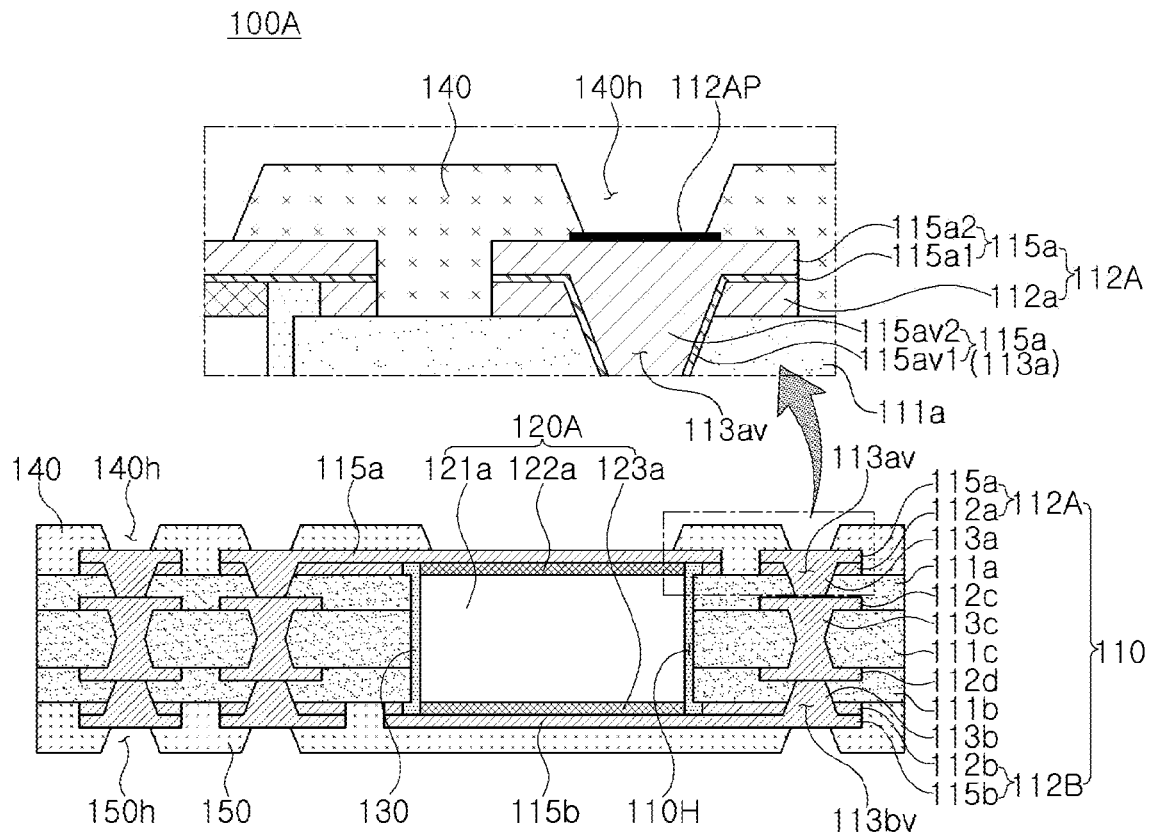
FIG. 3 is a schematic cross-sectional view illustrating an example of an electronic component-embedded substrate.

FIG. 3 is a schematic cross-sectional view illustrating an example of an electronic component-embedded substrate.

Referring to FIG. 3, an electronic component-embedded substrate 100A according to an example may include a core structure 110 including a through-portion 110H, an electronic component 120A disposed in the through-portion 110H, and an insulator 130 filling at least a portion of the through-portion 110H and covering at least a portion of the electronic component 120A. If necessary, an electronic component-embedded substrate 100A may further include a first passivation layer 140 disposed on an upper side of the insulating layer, the core substrate 110 and the electronic component 120A and a second passivation layer 150 disposed on a lower side of the insulating layer, the core substrate 110 and the electronic component 120A. In an example, the electronic components 120A includes a body 121a and first and second connection electrodes 122a and 123a spaced apart from each other and disposed on both upper and lower surfaces of the body 121a, respectively.

The core substrate 110 includes insulating layers 111a, 111b and 111c, a first pattern layer 112a disposed on an upper surface of the insulating layers 111a, 111b and 111c, and a second pattern layer 112b disposed on a lower surface of the insulating layers 111a, 111b and 111c. A first metal layer 115a is disposed on an upper surface of the insulator 130. The first metal layer 115a is physically in contact with and electrically connects the first pattern layer 112a and the first connection electrode 122a. A second metal layer 115b is disposed on a lower surface of the insulator 130. The second metal layer 115b is physically in contact with and electrically connects the second pattern layer 112b and the second connection electrode 123a.

As previously described, the electronic component-embedded substrate 100A according to an example includes the first and second connection electrodes 122a and 123a physically in contact with the first and second metal layers 115a and 115b, respectively, without an additional via. In addition, the first and second metal layers 115a and 115b are physically in contact with the first and second pattern layers 112a and 112b of the core substrate 110, respectively. First and second wiring layers 112A and 112B of the core substrate 110 may be layers on which the first and second pattern layers 112a and 112b are patterned, together with the first and second metal layers, respectively. For example, the first wiring layer 112A may be a patterned layer including the first pattern layer 112a and at least a portion of the first metal layer 115a disposed on an upper surface of the first pattern layer 112a, and the second wiring layer 112B may be a patterned layer including the second pattern layer 112b and at least a portion of the second metal layer 115*b* disposed on a lower surface of the second pattern layer 112*b*. Consequently, an electrical connection path may be provided between the first and second wiring layers 112A and 112B of the core substrate 110 and the first and second connection electrodes 122*a* and 123*a* of the electronic component 120A through the first and second metal layers 115*a* and 115*b* without a via. Accordingly, an overall thickness of the electronic component-embedded substrate 100A can be reduced, even when the electronic component 120A is built therein as a greater thickness is barely necessary.

Meanwhile, an upper surface of the insulator 130, that of the first connection electrode 122*a*, and that of the first pattern layer 112*a* may be coplanar with each other. The first metal layer 115*a* is horizontally disposed on the coplanar upper surfaces of the insulator 130, the first connection electrode 122*a* and the first pattern layer 112*a* to be physically in contact therewith. Further, a lower surface of the insulator 130, that of the second connection electrode 122*b*, and that of the second pattern layer 112*b* may be coplanar with each other. The second metal layer 115*b* is horizontally disposed on the coplanar lower surfaces of the insulator 130, the second connection electrode 123*a* and the second pattern layer 112*b* to be physically in contact therewith. As described, once the coplanar surfaces are disposed on the upper and lower surfaces, the first and second metal layers 115*a* and 115*b* are formed respectively thereon to provide an electrical connection path. In this case, the first and second metal layers 115*a* and 115*b* can be formed stably and to be more effective in slimming. Further, the first and second wiring layers 112A and 112B including at least portions of the first and second metal layers 115*a* and 115*b*, respectively, may easily have finer printed circuit boards. Meanwhile, as used herein, the term "coplanar" refers to a case of being on completely the same plane and being a substantially same plane.

Meanwhile, the core substrate 110 includes a first wiring via 113*a* connected to the first wiring layer 112A and a second wiring via 113*b* connected to the second wiring layer 112B. The first wiring via 113*a* may be a via in which a first via hole 113*av* passing through the first pattern layer 112*a* and further passing through at least a portion 111*a* of the insulating layers 111*a*, 111*b* and 111*c* is filled with the first metal layer 115*a*. For example, the first wiring via 113*a* may pass through the first pattern layer 112*a* and at least a portion 111*a* of the insulating layers 111*a*, 111*b* and 111*c*. The second wiring via 113*b* may be a via in which a second via hole 113*bv* passing through the second pattern layer 112*b* and further passing through at least the other portion 111*b* of the insulating layers 111*a*, 111*b* and 111*c* is filled with the second metal layer 115*b*. For example, the second wiring via 113*b* may pass through the second pattern layer 112*b* and at least the other portion of the insulating layers 111*a*, 111*b* and 111*c*. As described, when the first and second wiring vias 113*a* and 113*b* are formed by passing through the first and second pattern layers 112*a* and 112*b*, connection reliability of the first and second wiring vias 113*a* and 113*b* may be improved by intermetallic connection between the first and second wiring vias 113*a* and 113*b* and the first and second pattern layers 112*a* and 112*b*.

Hereinbelow, constitutional elements of an electronic component-embedded substrate 110A according to an example will be described in more detail with reference to the accompanying drawings.

The core substrate 110 includes first to third insulating layers 111*a*, 111*b*, 111*c*, a first wiring layer 112A disposed on an upper surface of the first insulating layer 111*a*, and a second wiring layer 112B disposed on a lower surface of the second insulating layer 111*b*. In an example, the core substrate 100 further includes third and fourth wiring layers 112*c* and 112*d* embedded inside the first to third insulating layers 111*a*, 111*b* and 111*c*. The third and fourth wiring layers 112*c* and 112*d* are disposed respectively on the upper and lower surfaces of the third insulating layer 111*c*. In an example, the first to third wiring vias 113*a*, 113*b* and 113*c* are formed respectively in the first to third insulating layers 111*a*, 111*b*, 111*c*. The first to third wiring vias 113*a*, 113*b* and 113*c* passes through the first to third insulating layers 111*a*, 111*b* and 111*c*, respectively, and electrically interconnect the first to fourth wiring layers 112A, 112B, 112*c* and 112*d* disposed on different layers. If necessary, a build-up layer, a wiring layer and a wiring via may be additionally formed on an upper and/or lower side of the core board 110.

An insulating material may be used as a material of the first to third insulating layers 111*a*, 111*b* and 111*c*. In this case, a thermosetting resin such as an epoxy resin, a thermoplastic resin such as a polyimide resin, or a material including a glass fiber (glass cloth, glass fabric) and/or a stiffener such as an inorganic filler, for example, prepreg (PPG), Ajinomoto Build-up Film (ABF), copper clad laminate (CCL), or unclad CCL may be used as the insulating material. As an unlimited example, prepreg may be used as a material of the first and second insulating layers 111*a* and 111*b* while CCL may be used as that of the third insulating layer 111*c*. If necessary, a metal plate, a glass plate or a ceramic plate may be used as a material of the third insulating layer 111*c*. Alternatively, a liquid crystal polymer (LCP) may be used as a material of the third insulating layer 111*c*. If necessary, photo image-able dielectric (PID) may be used as a material of the first and second insulating layers 111*a* and 111*b*.

The first to third insulating layers 111*a*, 111*b* and 111*c* may include the same material. In this case, boundaries thereof may be unclear according to processes thereof. For example, the first to third insulating layers 111*a*, 111*b* and 111*c* may be treated as a single insulating layer, but is not limited thereto. Boundaries may be present when different materials are included and even when the same materials are included. For example, they may be treated as multiple insulating layers. If necessary, the third insulating layer 111*c* may be disposed as a core layer while the first and second insulating layers 111*a* and 111*b* are disposed as build-up layers, resulting in the third insulating layer 111*c* thicker than each of the first and second insulating layers 111*a* and 111*b*.

Metal materials may be used as a material of the first to fourth wiring layers 112A, 112B, 112*c* and 112*d*. Copper (Cu), aluminum (Al), silver (Ag), tin (Sn), gold (Au), nickel (Ni), lead (Pb), titanium (Ti), or alloys thereof may be used as the metal materials. The first to fourth wiring layers 112A, 112B, 112*c* and 112*d* may be formed by a plating process such as an additive process (AP), semi-additive process (SAP), modified semi additive process (MSAP), tenting (TT), or the like, and may consequently include a seed layer, which is an electroless plating layer, and an electrolytic plating layer formed based on such seed layer. The first to fourth wiring layers 112A, 112B, 112*c* and 112*d* may perform various functions depending on a design of each layer. For example, ground (GND) patterns, power (PWR) patterns, signal (S) patterns, or the like, may be included. The signal (S) patterns may include various signals (e.g., such as data signals, and the like) excluding the GND patterns, the PWR patterns, and the like. If necessary, the GND patterns and the PWR patterns may be an identical pattern. These patterns may include line patterns, plane patterns and/or pad patterns.

The first wiring layer 112A may be a patterned layer including the first pattern layer 112a and at least a portion of the first metal layer 115a disposed on an upper surface of the first pattern layer 112a. That is, as described in the following process, the first wiring layer 112A may be patterned while having the first pattern layer 112a and the first metal layer 115a laminated. The first pattern layer 112a may be a single layer metal foil. Further, the first metal layer 115a may include a 1-1 metal layer 115a1 and a 1-2 metal layer 115a2 disposed on the 1-1 metal layer 115a1 and thicker than the 1-1 metal layer 115a1. The 1-1 metal layer 115a1 may be a seed layer, which is an electroless plating layer, while the 1-2 metal layer 115a2 may be an electrolytic plating layer formed based on such a seed layer. Accordingly, a number of the first metal layers 115a may be larger than that of the first pattern layer 112a. Meanwhile, a thickness of the first metal layers 115a may be larger than that of the first pattern layer 112a. Further, a thickness of the 1-2 metal layers 115a2 may be larger than that of the first pattern layer 112a. However, the thicknesses are not limited thereto. If necessary, the first pattern layer 112a may be a multilayer including a seed layer, which is an electroless plating layer, and an electrolytic plating layer.

The second wiring layer 112B may be a patterned layer including the second pattern layer 112b and at least a portion of the second metal layer 115b disposed on a lower surface of the second pattern layer 112b. That is, as described in the following process, the second wiring layer 112B may be patterned while having the second pattern layer 112b and the second metal layer 115b laminated. The second pattern layer 112b may be a single layer metal foil. Further, the second metal layer 115b, similarly to the first metal layer 115a, may include a 2-1 metal layer and a 2-2 metal layer disposed on the 2-1 metal layer and thicker than the 2-1 metal layer. The 2-1 metal layer may be a seed layer, which is an electroless plating layer, while the 2-2 metal layer may be an electrolytic plating layer formed based on such seed layer. Accordingly, a number of the second metal layers 115b may be larger than that of the second pattern layer 112b. Meanwhile, a thickness of the second metal layers 115b may be larger than that of the second pattern layer 112b. Further, a thickness of the 2-2 metal layers may be larger than that of the second pattern layer 112b. However, the thicknesses are not limited thereto. If necessary, the second pattern layer 112b may be a multilayer including a seed layer, which is an electroless plating layer, and an electrolytic plating layer.

The wiring layer 112A may be a patterned layer including the first pattern layer 112a and at least a portion of the first metal layer 115a disposed on the upper surface of the first pattern layer 112a, and may be thicker than each of the third and fourth wiring layers 112c and 112d. Similarly, the second wiring layer 112B may be a patterned layer including the second pattern layer 112b and at least a portion of the second metal layer 115b disposed on the lower surface of the second pattern layer 112b, and may be thicker than each of the third and fourth wiring layers 112c and 112d. The thicknesses of the first and second wiring layers 112A and 112b may be substantially the same, but are not limited thereto.

Metal materials may also be used as a material of the first to third wiring vias 113a, 113b and 113c. Copper (Cu), aluminum (Al), silver (Ag), tin (Sn), gold (Au), nickel (Ni), lead (Pb), titanium (Ti), or alloys thereof may be used as the metal materials. The first to third wiring vias 113a, 113b and 113c may be formed by a plating process such as AP, SAP, MSAP, TT, or the like, and may consequently include a seed layer, which is an electroless plating layer, and an electrolytic plating layer formed based on such seed layer. The first to third wiring vias 113a, 113b and 113c may be entirely filled with the metal materials and may include the metal materials formed along a wall of the via hole. Further, known shapes such as an hourglass shape, a cylindrical shape, a tapered shape, and the like, may be applied to the first to third wiring vias 113a, 113b and 113c. For example, the third wiring via 113c may have an hourglass shape while the first and second wiring vias 113a and 113b may have shapes tapered in an opposite direction. The first to third wiring vias 113a, 113b and 113c may perform various functions depending on a design of each layer. For example, the first to third wiring vias 113a, 113b and 113c may include wiring vias for signal connection, ground connection, power connection, respectively. The wiring vias for the ground and power connections may be an identical wiring via.

The first wiring via 113a may be a via in which a first via hole 113av passing through the first pattern layer 112a and further passing through the first insulating layer 111a is filled with the first metal layer 115a. For example, the first wiring via 113a may be formed by forming a first via hole 113av passing through the first pattern layer 112a and the first insulating layer 111a followed by filling with the first metal layer 115a when forming the first metal layer 115a. Accordingly, the first wiring via 113a may pass through the first pattern layer 112a and the first insulating layer 111a. The first wiring via 113a is disposed on a 1-1 metal via layer 115av1 and a 1-2 metal via layer 115av2 disposed on the 1-1 metal via layer 115av1 and thicker than the 1-1 metal via layer 115av1. The 1-1 metal via layer 115av1 may be a seed layer, which is an electroless plating layer, while the 1-2 metal via layer 115av2 is an electrolytic plating layer formed based on such seed layer. The 1-1 metal via layer 115av1 may an extended 1-1 metal layer 115a1, and the 1-2 metal via layer may be an extended 1-2 metal layer 115a2.

The second wiring via 113b may be a via in which a second via hole 113bv passing through the second pattern layer 112b and further passing through the second insulating layer 111b is filled with the second metal layer 115b. For example, the second wiring via 113b may be formed by forming a second via hole 113bv passing through the second pattern layer 112b and the second insulating layer 111b followed by filling with the second metal layer 115b when forming the second metal layer 115b. Accordingly, the second wiring via 113b may pass through the second pattern layer 112b and the second insulating layer 111b. The second wiring via 113b, similarly to the first wiring via 113a, is disposed on a 2-1 metal via layer and a 2-2 metal via layer disposed on the 2-1 metal via layer and thicker than the 2-1 metal via layer. The 2-1 metal via layer may be a seed layer, which is an electroless plating layer, while the 2-2 metal via layer is an electrolytic plating layer formed based on such seed layer. The 2-1 metal via layer may an extended 2-1 metal layer, and the 2-2 metal via layer may be an extended 2-2 metal layer.

The first and second metal layers 115a and 115b are constitutional elements for an electrical connection of the first and second connection electrodes 122a and 122b with the first and second wiring layers 112A and 112B without a via. As described above, at least the other portion of each of the first and second metal layers 115a and 115b may be a portion of the first and second wiring vias 113a and 113b. Metal materials may also be used as a material of the first and second metal layers 115a and 115b. Copper (Cu), aluminum (Al), silver (Ag), tin (Sn), gold (Au), nickel (Ni), lead (Pb), titanium (Ti), or alloys thereof may be used as the metal materials. Each of the first and second metal layers 115a and 115b may be formed by a plating process such as AP, SAP, MSAP, TT, or the like, and may consequently include a seed layer, which is an electroless plating layer, and an electrolytic plating layer formed based on such seed layer.

The electronic component 120A includes a body 121a, a first connection electrode 122a disposed on an upper surface of the body 121a, and a second connection electrode 123a disposed on a lower surface of the body 121a. The body 121a may be a dielectric layer containing a known dielectric material such as aluminum nitride (AlN), tantalum oxide ($Ta_2O_5$), alumina ($Al_2O_3$), hafnium oxide ($HfO_2$), $SiO_2$/ $HfO_2/SiO_2$ (SHS), $Al_2O_3/HfO_2/Al_2O_3$ (AHA), or the like. The first and second connection electrodes 122a and 123a may be a metal layer containing a known metal material such as Cu, Al, Ag, Sn, Au, Ni, Pb, Ti, or alloys thereof. In other words, an electronic component 120A according to an example may be a metal-insulator-metal (MIM) capacitor, but is not limited thereto. If necessary, a die having a connection electrode may be disposed as the electronic component 120A. In this case, an electrical connection path involving the previously described metal layer on only one of the upper and lower sides may be designed according to the die.

The insulator 130 may fix the electronic component 120A by embedding at least a portion of the electronic component 120A, and may further provide an insulating region inside the through-portion 110H. An insulating material may be used as a material of the insulator 130. A thermosetting resin such as an epoxy resin, a thermoplastic resin such as a polyimide resin, a material including a glass fiber and/or a stiffener such as an inorganic filler, for example, prepreg, ABF, or the like, may be used as the insulating material. If necessary, a photo-image-able encapsulant (PIE) may be used. Meanwhile, the insulator 130 may be configured to be multiple layers which may include the same or different materials and may have clear or unclear boundaries.

The first and second passivation layers 140 and 150 may protect the internal structure of the electronic component-embedded substrate 100A according to an example from physical and chemical damage from outside. The first and second passivation layers 140 and 150 may include a thermosetting resin. For example, the first and second passivation layers 140 and 150 may be ABFs, but are not limited thereto. If necessary, PID may be included. The first passivation layer 140 is disposed on an upper surface of the first insulating layer 111a to cover the first wiring layer 112A and the first metal layer 115a. The second passivation layer 15 is disposed on a lower surface of the second insulating layer 111b to cover the second wiring layer 112B and the second metal layer 115b. The first and second passivation layers 140 and 150 may have a plurality of first and second openings 140h and 150h. A plurality of the first and second openings 140h and 150h may expose at least a portion of each of the first and second wiring layers 112A and 112B. If necessary, each opening of the first and second openings 140h and 150h may be formed with a plurality of via holes.

A surface-treated layer 112AP may be disposed on an exposed upper surface of the first wiring layer 112A for improvement of the connection reliability with an electric connection metal such as a solder. The surface-treated layer 112AP may include a metal. For example, the surface-treated layer 112AP may be formed by electrolytic gold plating, electroless gold plating, OSP or electroless tin plating, electroless silver plating, electroless nickel plating/ substitute gold plating, DIG plating, HASL, or the like. Similarly, a surface-treated layer 112AP may also be disposed on an exposed lower surface of the second wiring layer 112B, and a detailed description thereof is the same as previously described. If necessary, an under-bump metal (UBM) may be disposed on each of the openings instead of the surface-treated layer, for the reliability improvement.

Meanwhile, an electronic component-embedded substrate 100A according to an example may be used as a package substrate on which an electronic component such as a semiconductor chip is mounted, for example, ball grid array (BGA), and may be used as an interposer according to a wiring design, but is not limited thereto.

Figure 4:
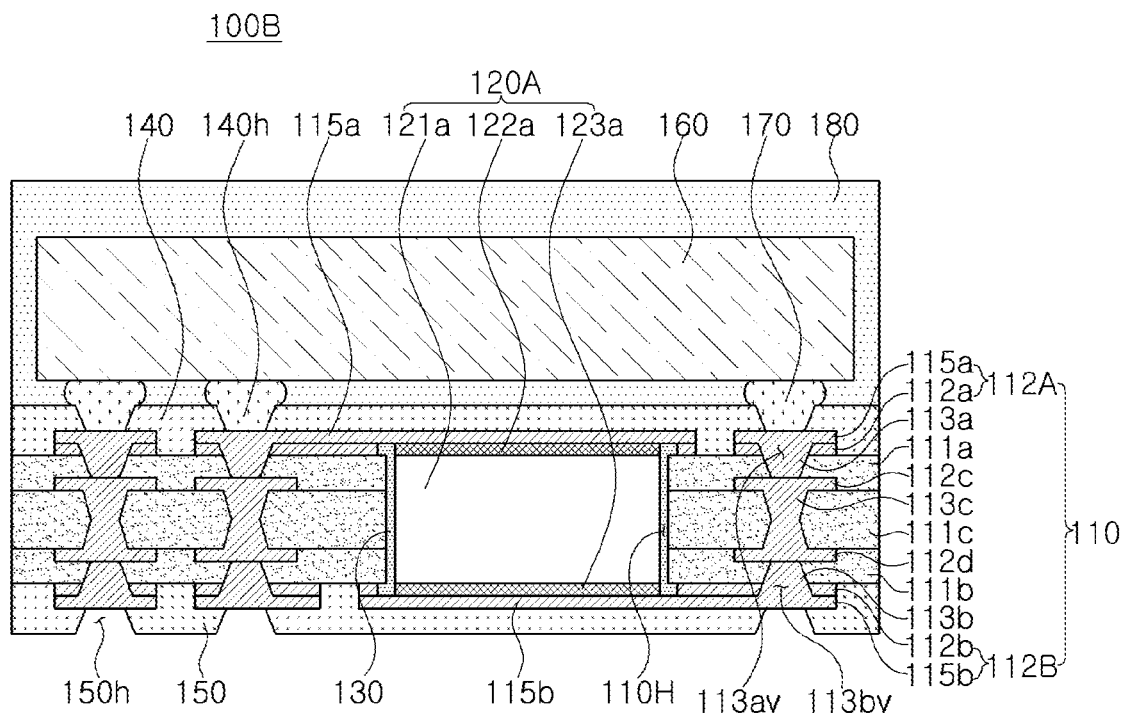
FIG. 4 is a schematic cross-sectional view illustrating an example of a modification of the electronic component-embedded substrate of FIG. 3.

FIG. 4 is a schematic cross-sectional view illustrating an example of a modification of the electronic component-embedded substrate of FIG. 3.

Based on FIG. 4, an electronic component-embedded substrate 100B according to a modification example further includes a second electronic component 160 disposed on an upper surface of the first passivation layer 140, a plurality of the electric connection metal 170 independently disposed on a plurality of the first openings 140h and electrically connecting the second electronic component 160 and the exposed first wiring layer 112A, and a molding 180 disposed on the upper surface of the first passivation layer 140 and covering at least a portion of the second electronic component 160. Other constitutions are the same as in the electronic component-embedded substrate 100A according to the previously described example, and only additional constitutional elements will be described.

The second electronic component 160 may be a known active or passive component. There may be a plurality of the second electronic component 160, where they may be the same type components or different types of components. The active component may include various types of integrated circuit dies. The passive components may include various types of chip type inductors, chip-type capacitors, chip-type beads, and the like. The second electronic component 160 is electrically connected to the first wiring layer 112A through the electric connection metal 170 and to the first connection electrode 122a of the first electronic component 120A through the first metal layer 115a. In some cases, the second electronic component 160 may be electrically connected to the second wiring layer 112B through an electrical path inside the core substrate 110. In this case, the second electronic component 160 is electrically connected to the second connection electrode 123a of the first electronic component 120A through the second metal layer 115b.

The electric connection metal 170 may be for a surface mounting of the second electronic component 160. The electric connection metal 170 may be formed of a metal, such as tin (Sn), having a melting point lower than that of copper (Cu), or an alloy containing Sn. For example, the electric connection metal 170 may be formed of a solder, but this is merely an example, and is not particularly limited thereto. The electric connection metal 170 may be land, a ball, a pin, or the like. The electric connection metal 170 may be configured to be multi-layers or a single layer. The multilayer electric connection metal 170 may include a copper pillar and solder while a single layer electric connection metal 170 may contain tin-silver solder, but this is merely an example and is not limited thereto. The electric connection metal 170 is not particularly limited in terms of a number, distance, arrangement, or the like, and can be sufficiently modified according to a design thereof.

The molding 180 can protect the second electronic component 160 and fix the second electronic component 160. Insulating materials may be used as a material of the molding. A thermosetting resin such as an epoxy resin, a thermoplastic resin such as a polyimide resin, a material including a glass fiber and/or a stiffener such as an inorganic filler, for example, prepreg, ABF, or the like, may be used as the insulating material. If necessary, epoxy molding compound (EMC) may be used.

Figure 5:
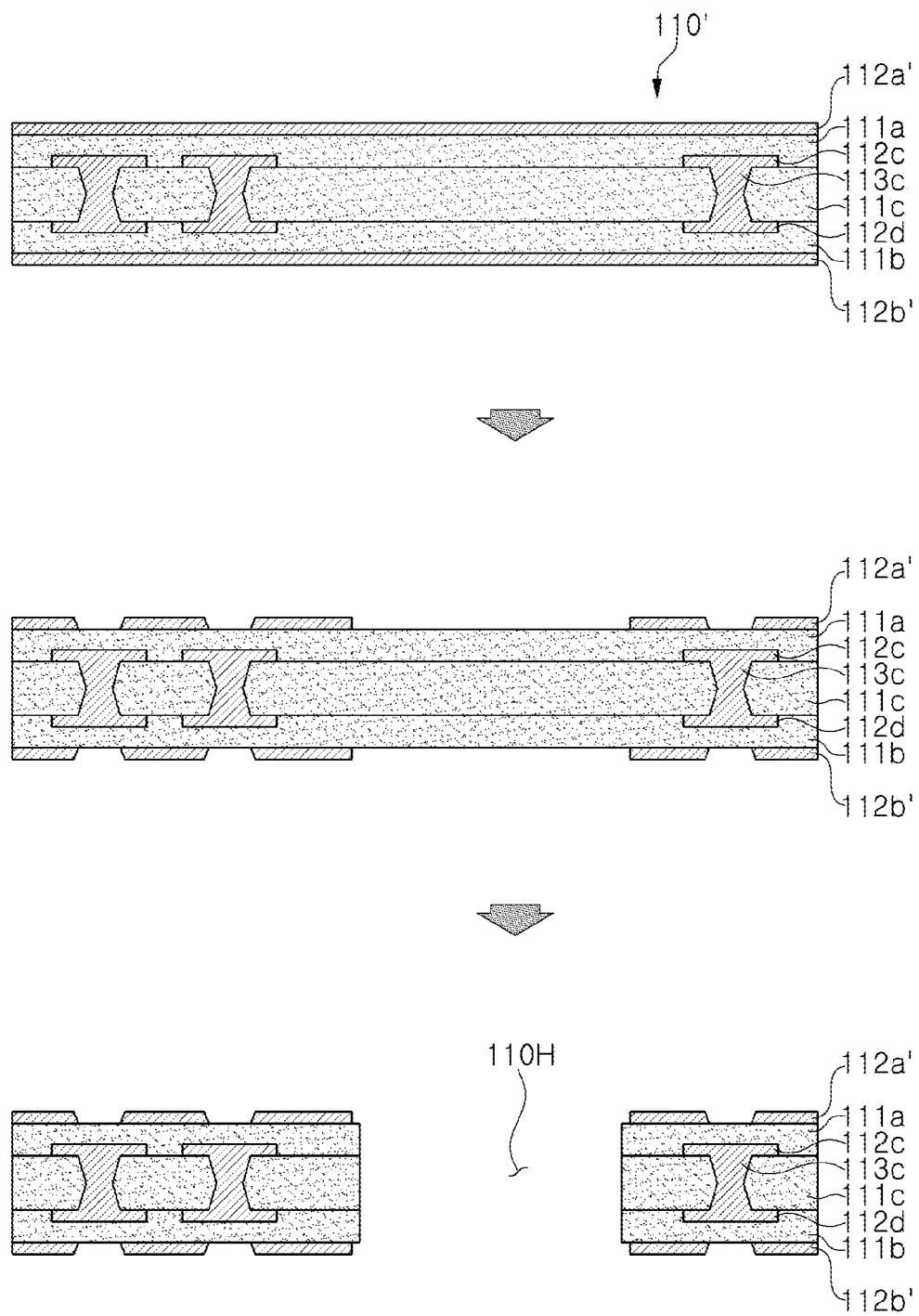
FIGS. 5 to 7 are examples schematically illustrating manufacturing of the electronic component-embedded substrate of FIG. 3.
Figure 6:
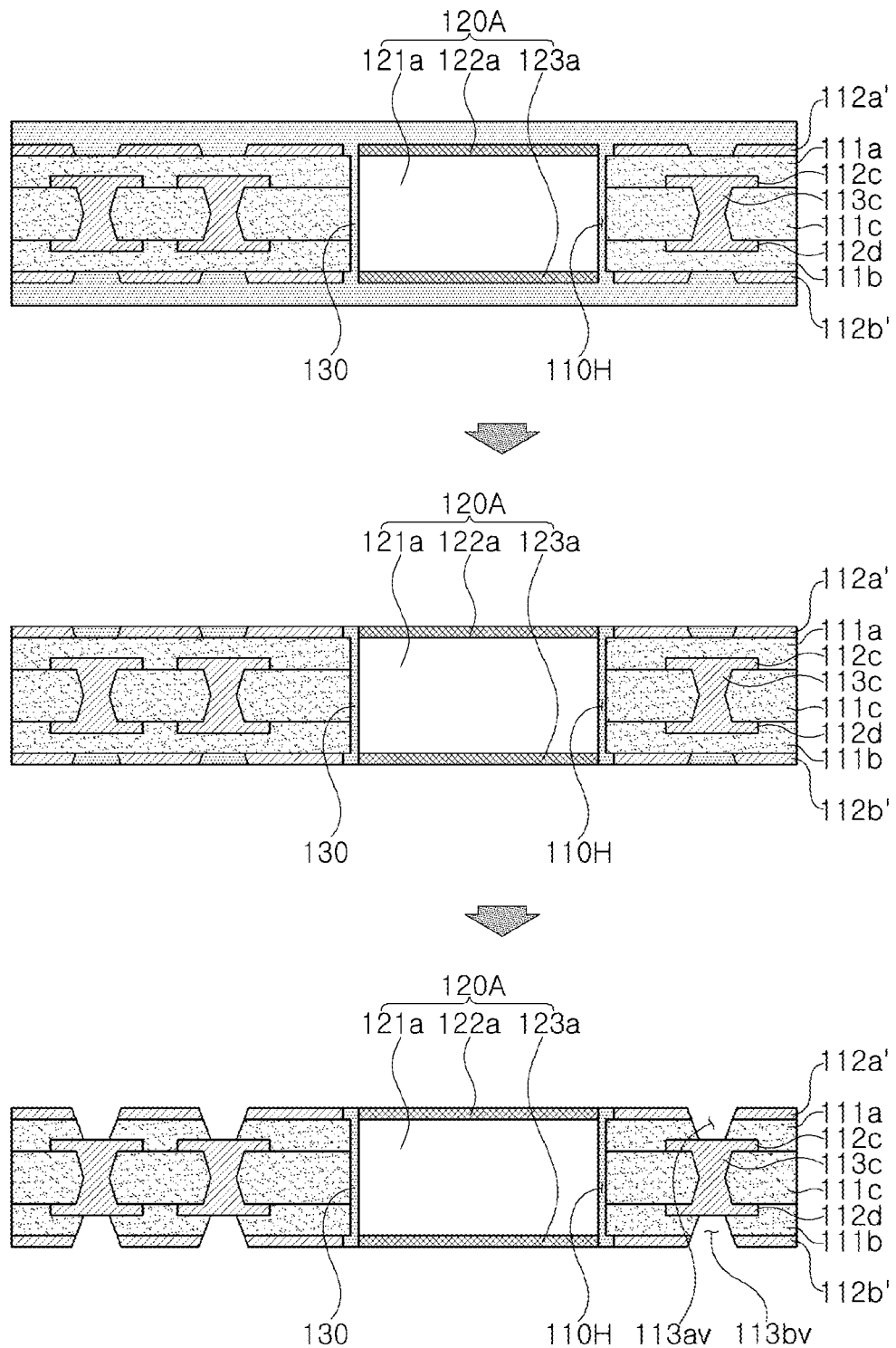
Figure 7:
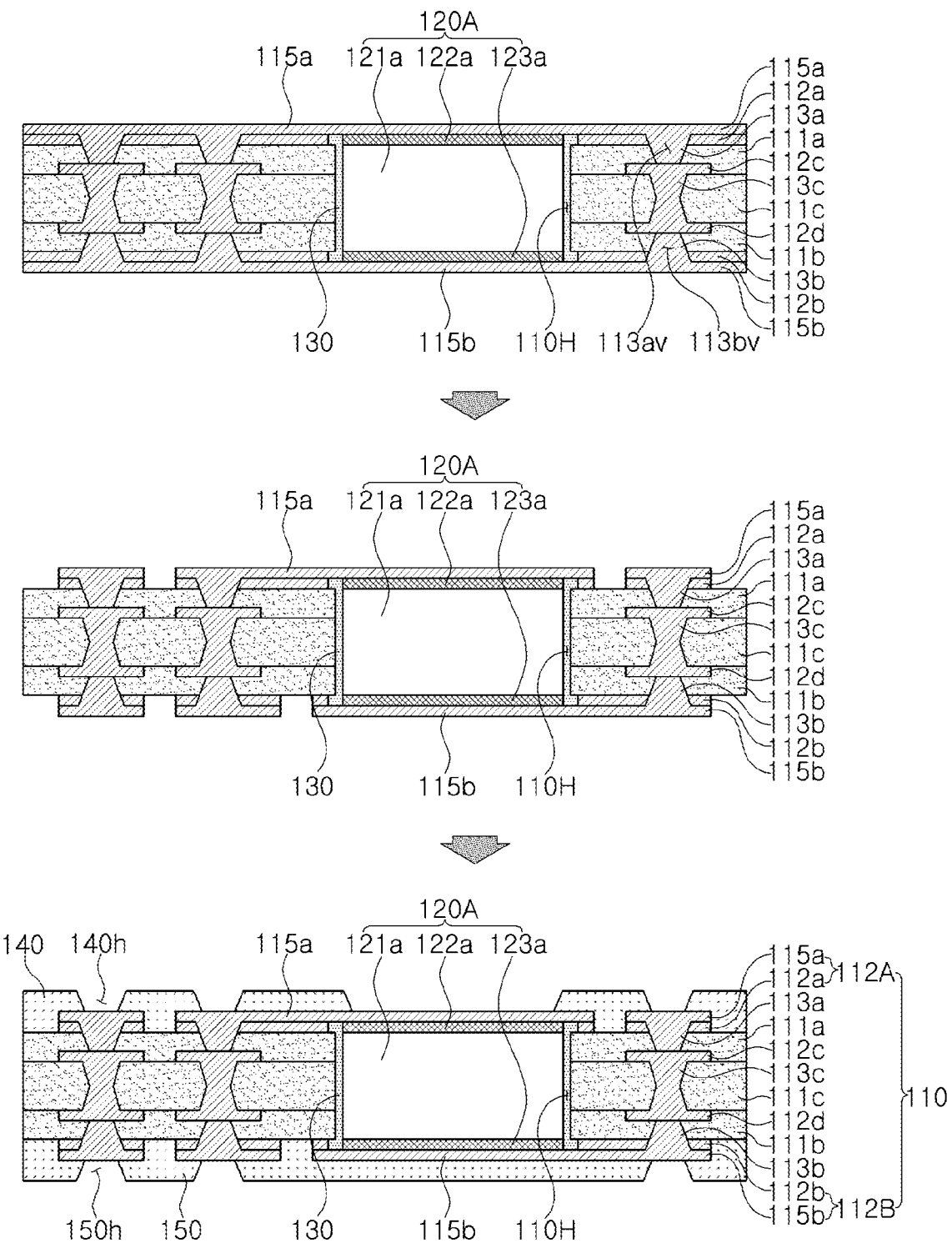

FIGS. 5 to 7 are diagrams schematically illustrating an example of the manufacturing process of the electronic component-embedded substrate of FIG. 3.

Based on FIG. 5, a precursor 110' of the core substrate 110 is first prepared. The precursor 110' may be formed by forming the third and fourth wiring layers 112c and 112d as well as the third wiring via 113c using a CCL, followed by laminating a prepreg in which the CCL is formed on the upper and lower surfaces of the third insulating layer 111c to form the first and second insulating layers 111a and 111b and first and second metal foils 112a' and 112b'. At least a portion of the first and second metal foils 112a' and 112b' are then removed using etching. A through-portion 110H passing through the first to third insulating layers 111a, 111b and 111c is formed in the partial region in which the first and second metal foils 112a' and 112b' are removed using a laser drill and/or a mechanical drill. If necessary, the through-portion 110H is subject to desmearing treatment, or the like.

Referring to FIG. 6, the electronic component 120A is disposed in the through-portion 110H and covered with the insulator 130. For example, a lower side of the through-portion 110H is covered using a tape, and the electronic component 120A is attached to the tape to dispose the electronic component 12A in the through-portion 110H. The upper side of the tape is covered with the insulator 130 to embed the electronic component 120A. The tape is then removed and the other side of the electronic component 120A is covered by the insulator 130. The first and second metal foils 112a' and 112b' and the first and second connection electrodes 122a and 123a of the electronic component 120A are exposed using a plannerizing process, such as a grinding process. During the plannerizing, the previously described coplanar surface can be provided. The first and second via holes 113av and 113bv are then formed in the partial region in which the first and second metal foils 112a' and 112b' are removed using a laser drill and/or a mechanical drill. Consequently, the first and second via holes 113av and 113bv pass through the first and second metal foils 112a' and 112b', and the first and second insulating layers 111a and 111b, respectively. If necessary, the first and second via holes 113av and 113bv are subject to desmearing treatment, or the like.

Referring to FIG. 7, the first and second metal layers 115a and 115b are formed by plating on a flat surface provided by grinding. The first and second metal layers 115a and 115b fill the first and second via holes 113av and 113bv to form the first and second wiring vias 113a and 113b. By patterning the first and second metal foils 112a' and 112b' and the first and second metal layers 115a and 115b formed on the first and second metal foils 112a' and 112b', the first and second wiring layers 112A and 112B including the first and second pattern layers 112a and 112b and the first and second metal layers 115a and 115b formed on the first and second pattern layers 112a and 112b are formed. The first and second passivation layers 1140 and 150 are laminated to form the first and second openings 140h and 160h on desired positions. Through the series of processes, the electronic component-embedded substrate 100A according to the previously described example can be manufactured.

Figure 8:
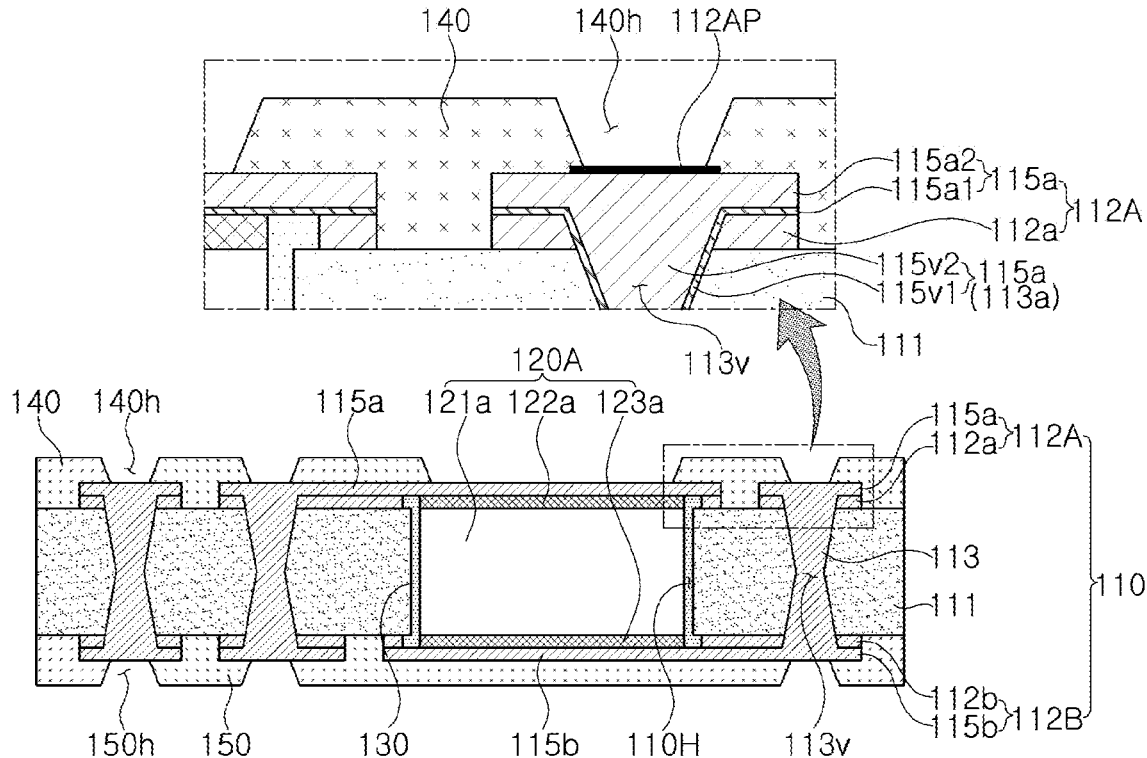
FIG. 8 is a schematic cross-sectional view illustrating another example of an electronic component-embedded substrate.

FIG. 8 is a schematic cross-sectional view illustrating another example of an electronic component-embedded substrate.

Figure 9:
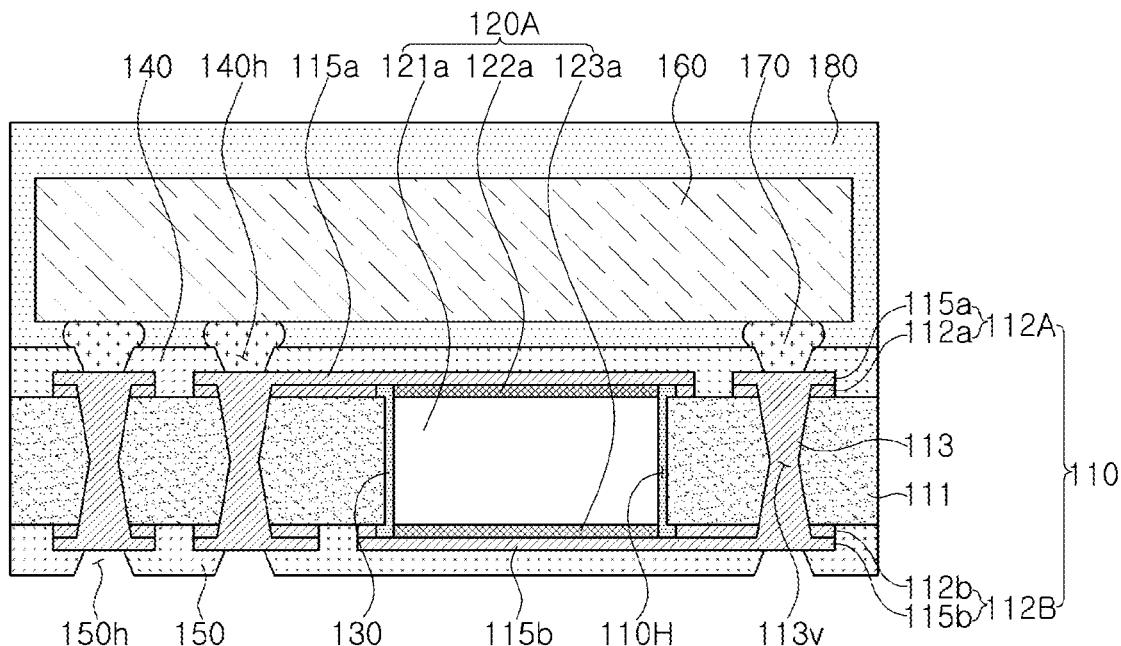
FIG. 9 is a schematic cross-sectional view illustrating an example of a modification of the electronic component-embedded substrate of FIG. 8.

FIG. 9 is a schematic cross-sectional view illustrating an example of a modification of the electronic component-embedded substrate of FIG. 8.

Referring to FIGS. 8 and 9, an electronic component-embedded substrate 100C according to another example and an electronic component-embedded substrate 100D according to a modification example thereof are more simplified compared to the electronic component-embedded substrate 100A according to an example and the electronic component-embedded substrate 100B according to the modification example thereof. For example, the core substrate 110 includes an insulating layer 111, a first wiring layer 112A disposed on an upper surface of the insulating layer 111, a second wiring layer 112B disposed on a lower surface of the insulating layer 111, and a wiring via 113 electrically connecting the first and second wiring layers 112A and 112B. In this case, the first and second wiring layers 112A and 112B may be layers on which the first and second pattern layers 112a and 112b are patterned together with the first and second metal layers 115a and 115b, respectively. Further, the wiring via 113 may be a via in which a via hole 113v passing through the first and second pattern layers 112a and 112b and further passing through the insulating layer 111 is filled with the first and second metal layers 115a and 115b. For example, the wiring via 113 may pass through the first and second pattern layers 112a and 112b and the insulating layer 111. Meanwhile, the wiring via 113 may include a first metal via layer 115v1 and a second metal via layer 115v2 disposed on the first metal via layer 115v1 and thicker than the first metal via layer 115v1. The first metal via layer 115v1 may be extended from the 1-1 metal layer 115a1 and the 2-1 metal layer, and thus, the 1-1 metal layer 115a1 and the 2-1 metal layer may be connected through the first metal via layer 115v1. Additionally, the second metal via layer 115v2 may be extended from the 1-2 metal layer 115a2 and the 2-2 metal layer, and thus, the 1-2 metal layer 115a2 and the 2-2 metal layer may be connected through the 1-2 metal via layer 115v2. The other descriptions are substantially the same as previously described, and thus, detailed descriptions thereof are omitted.

Figure 10:
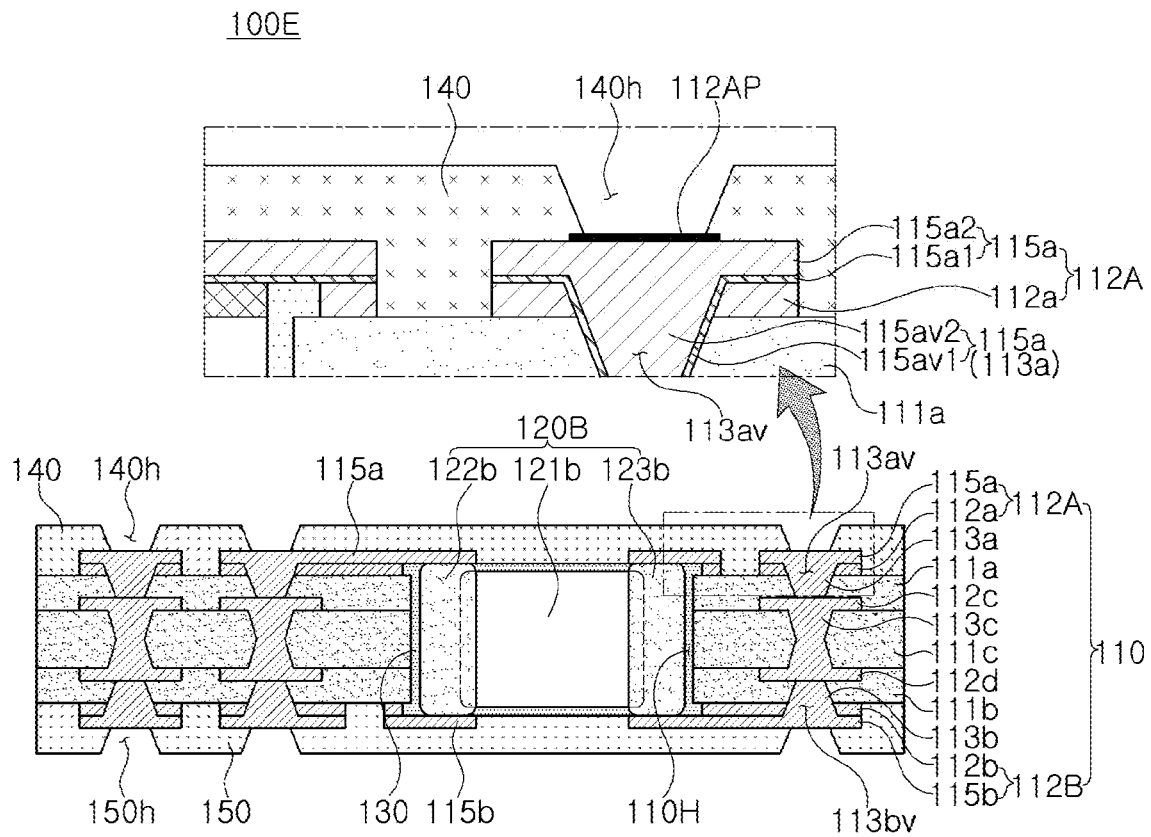
FIG. 10 is a schematic cross-sectional view illustrating another example of an electronic component-embedded substrate.

FIG. 10 is a schematic cross-sectional view illustrating another example of an electronic component-embedded substrate.

Figure 11:
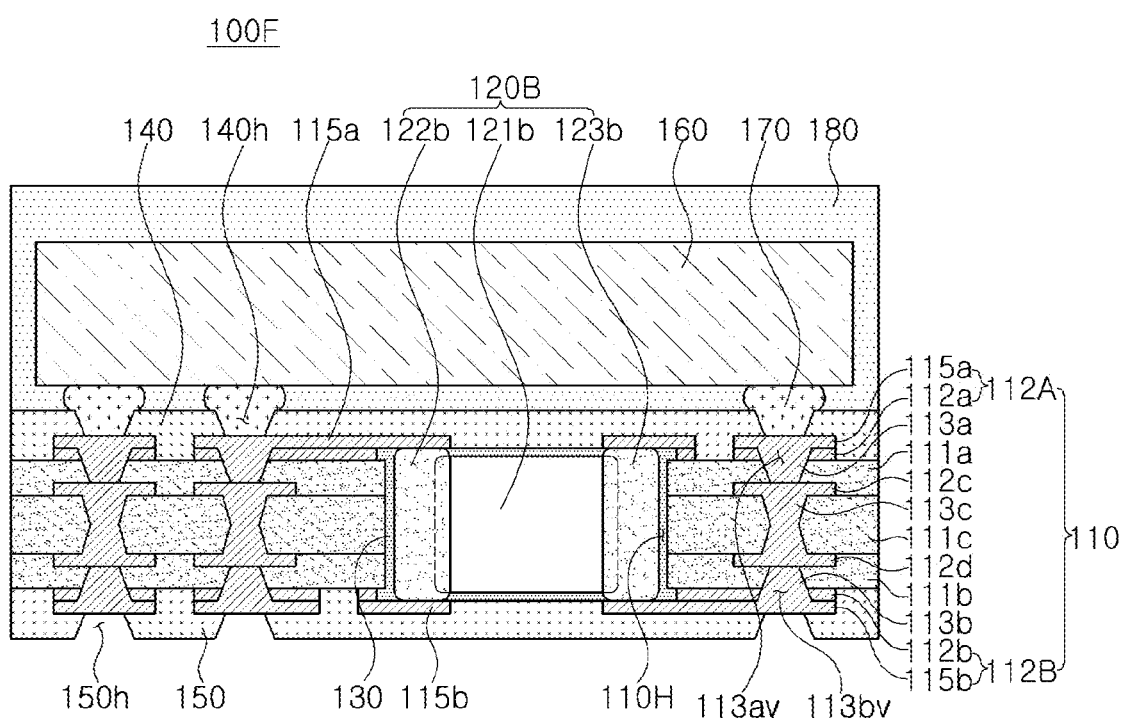
FIG. 11 is schematic cross-sectional view illustrating an example of a modification of the electronic component-embedded substrate of FIG. 10.

FIG. 11 is a schematic cross-sectional view illustrating an example of a modification of the electronic component-embedded substrate of FIG. 10.

Referring to FIGS. 10 and 11, an electronic component-embedded substrate 100E according to another example and an electronic component-embedded substrate 100F according to a modification example thereof include the electronic component 120B in a form different from the electronic component-embedded substrate 100A according to an example and the electronic component-embedded substrate 100B according to the modification example thereof. For example, the electronic component 120B includes a body 121b, a first connection electrode 122b disposed on a first side surface of the body 121b, and a second connection electrode 123b disposed on a second side surface, an opposite side of the first side surface, of the body 121b. A portion of the first connection electrode 122b may extend toward third and fourth side surfaces disposed between upper and lower surfaces of the body 121b and the first and second side surfaces of the body 121b. The first metal layer 115a is physically in contact with the first pattern layer 112a, at least a portion of an upper side of the first connection electrode 122b, and at least a portion of an upper side of the second connection electrode 123b to electrically connect the first pattern layer 112a with the first and second connection electrodes 122b and 123b. The second metal layer 115b is physically in contact with the second pattern layer 112b, at least a portion of a lower side of the second connection electrode 122b, and at least a portion of a lower side of the second connection electrode 123b to electrically connect the second pattern layer 112b with the first and second connection electrodes 122b and 123b. The body 121b may include dielectric layers and internal electrode layers alternately laminated. The dielectric layers may include ceramic powder having high permittivity, for example, a barium titanate ($BaTiO_3$) or strontium titanate ($SrTiO_3$) powder, but are not limited thereto. The internal electrode layers may be a conductive metal, for example, nickel (Ni), copper (Cu), palladium (Pd), gold (Au), or alloys thereof, but are not limited thereto. In other words, the electronic component 120B according to another example may be a multilayer ceramic capacitor (MLCC) or a low inductance chip capacitor (LICC), but is not limited thereto. The other descriptions are substantially the same as previously described, and thus, detailed descriptions thereof are omitted.

Figure 12:
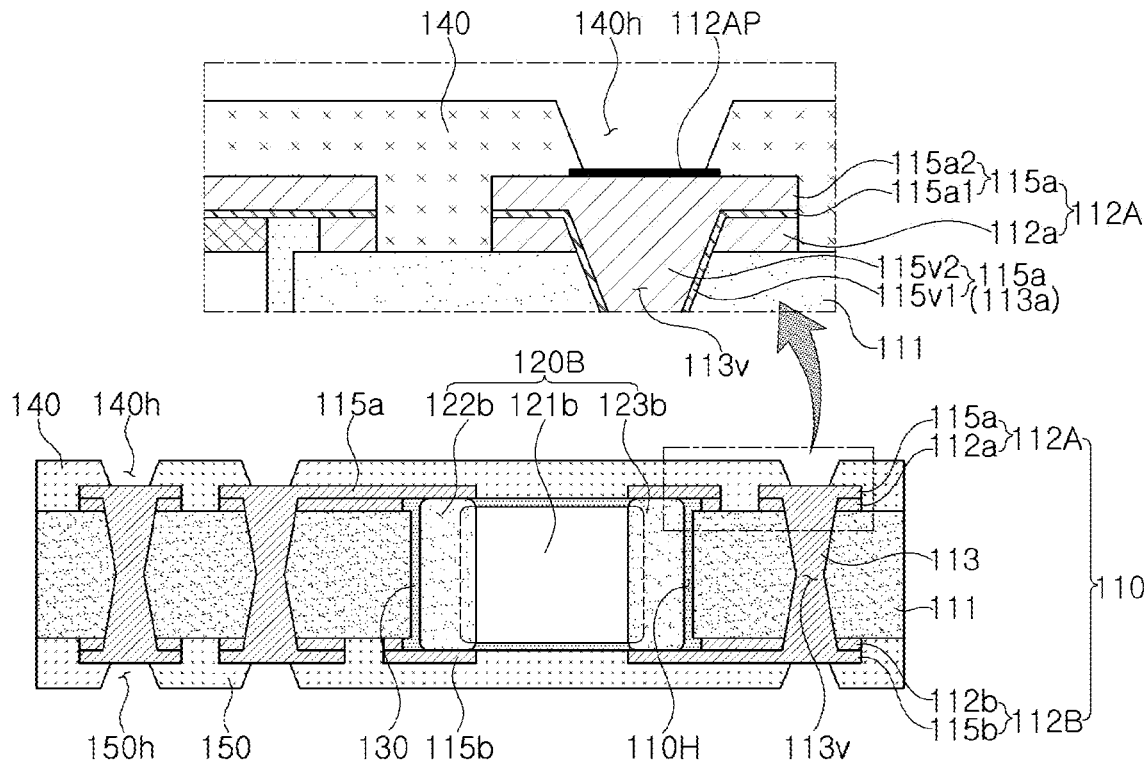
FIG. 12 is a schematic cross-sectional view illustrating another example of an electronic component-embedded substrate.

FIG. 12 is a schematic cross-sectional view illustrating another example of an electronic component-embedded substrate.

Figure 13:
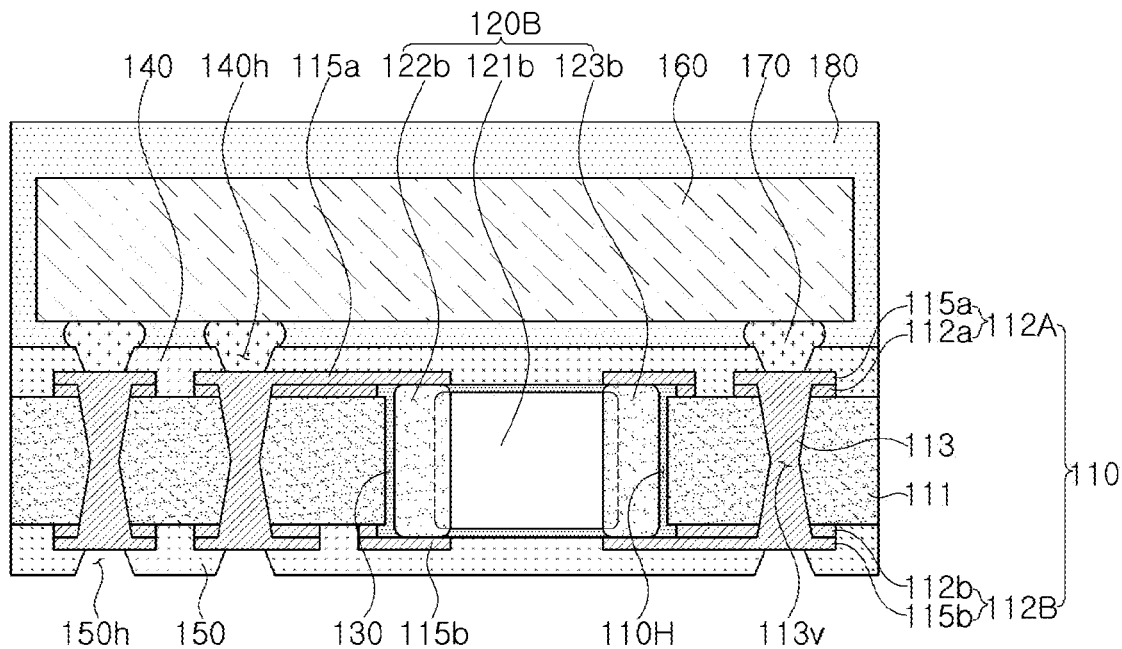
FIG. 13 is schematic cross-sectional view illustrating an example of a modification of the electronic component-embedded substrate of FIG. 12.

FIG. 13 is a schematic cross-sectional view illustrating an example of a modification of the electronic component-embedded substrate of FIG. 12.

Referring to FIGS. 12 and 13, an electronic component-embedded substrate 100G according to another example and an electronic component-embedded substrate 100H according to a modification example thereof are more simplified compared to the electronic component-embedded substrate 100E according to another example and the electronic component-embedded substrate 100F according to the modification example thereof. For example, the core substrate 110 includes an insulating layer 111, a first wiring layer 112A disposed on an upper surface of the insulating layer 111, a second wiring layer 112B disposed on a lower surface of the insulating layer 111, and a wiring via 113 electrically connecting the first and second wiring layers 112A and 112B. In this case, the first and second wiring layers 112A and 112B may be layers on which the first and second pattern layers 112a and 112b are patterned together with the first and second metal layers 115a and 115b, respectively. Further, the wiring via 113 may be a via in which a via hole 113v passing through the first and second pattern layers 112a and 112b and further passing through the insulating layer 111 is filled with the first and second metal layers 115a and 115b. For example, the wiring via 113 may pass through the first and second pattern layers 112a and 112b and the insulating layer 111. Meanwhile, the wiring via 113 may include a first metal via layer 115v1 and a second metal via layer 115v2 disposed on the first metal via layer 115v1 and thicker than the first metal via layer 115v1. The first metal via layer 115v1 may be extended from the 1-1 metal layer 115a1 and the 2-1 metal layer, and thus, the 1-1 metal layer 115a1 and the 2-1 metal layer may be connected through the first metal via layer 115v1. Additionally, the second metal via layer 115v2 may be extended from the 1-2 metal layer 115a2 and the 2-2 metal layer, and thus, the 1-2 metal layer 115a2 and the 2-2 metal layer may be connected through the second metal via layer 115v2. The other descriptions are substantially the same as previously described, and thus, detailed description thereof is omitted.

As one of the effects achieved in the present disclosures, an electronic component-embedded substrate which can be slimmed in spite of including an electronic component embedded therein can be provided.

As used herein, the terms "lower side," "lower portion," "lower surface," and the like, are used to refer to a downward direction with reference to a cross-section of the drawing, while the terms "upper side," "upper portion," "upper surface," and the like, are used to refer to a direction opposite to the above direction. However, the terms may be defined as above for ease of description, and the scope of right of the exemplary embodiments is not particularly limited to the above terms.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an example" may not refer to one same exemplary embodiment, but may be provided to describe and emphasize different unique features of each exemplary embodiment. The above suggested exemplary embodiments may be implemented do not exclude the possibilities of combination with features of other exemplary embodiments. For example, even though the features described in one exemplary embodiment are not described in the other exemplary embodiment, the description may be understood as relevant to the other exemplary embodiment unless otherwise indicated.

The terms used herein are only used to simply describe an exemplary embodiment, and are not intended to limit the present disclosure. A singular term includes a plural form unless otherwise indicated.

While exemplary embodiments have been shown and described above, it will be apparent to those skilled in the art that modifications and variations could be made without departing from the scope of the present invention as defined by the appended claims.

What is claimed is:

1. An electronic component-embedded substrate, comprising:
    a core structure comprising an insulating layer, a first pattern layer disposed on an upper surface of the insulating layer, and a through-portion passing through the insulating layer;
    a first electronic component disposed in the through-portion and comprising a connection electrode;
    an insulator disposed in a portion of the through-portion between the core structure and the first electronic component; and
    a first metal layer disposed on an upper surface of the first pattern layer; and
    a first wiring via extending from the first metal layer into a portion of the insulating layer, wherein at least a portion of the first metal layer is physically in contact with at least a portion of the connection electrode, and a first wiring layer, disposed on the upper surface of the insulating layer, comprises the first pattern layer and the first metal layer.

2. The substrate of claim 1, wherein the first wiring via passes through the first pattern layer and the portion of the insulating layer.

3. The substrate of claim 1, wherein an upper surface of the insulator, an upper surface of the at least a portion of the connection electrode, and the upper surface of the first pattern layer are coplanar with each other, wherein the first metal layer is disposed in a direction parallel to the coplanar upper surfaces of the insulator, the at least a portion of the connection electrode, and the first pattern layer to be physically in contact with the first pattern layer and the portion of the connection electrode.

4. The substrate of claim 1, wherein a number of the first metal layer is larger than a number of the first pattern layer.

5. The substrate of claim 1, wherein the core substrate further comprises a second wiring layer disposed on a lower surface of the insulating layer, wherein, on a lower surface of the insulator, a second metal layer is physically in contact with another portion of the connection electrode, and a portion of the second metal layer is comprised on the second wiring layer.

6. The substrate of claim 5, wherein the first wiring layer comprises the first pattern layer disposed on the upper surface of the insulating layer and the at least a portion of the first metal layer disposed on an upper surface of the first pattern layer, and the second wiring layer comprises the second pattern layer disposed on the lower surface of the insulating layer and at least a portion of the second metal layer disposed on a lower surface of the second pattern layer.

7. The substrate of claim 6, wherein the core structure further comprises a third wiring layer embedded in the insulating layer, and the first and second wiring layers are thicker than the third wiring layer.

8. The substrate of claim 6, wherein the core substrate further comprises third and fourth wiring layers disposed inside the insulating layer at different positions, the first wiring via connecting the first and third wiring layers to each other, a second wiring via connecting the second and fourth wiring layers to each other, and a third wiring via connecting the third and fourth wiring layers to each other, wherein the first wiring via passes through the first pattern layer and at least a portion of the insulating layer, and the second wiring via passes through the second pattern layer and at least another portion of the insulating layer.

9. The substrate of claim 6, wherein an upper surface of the insulator, an upper surface of the at least a portion of the connection electrode, and an upper surface of the first pattern layer are coplanar with each other, a lower surface of the insulator, a lower surface of at least the another portion of the connection electrode, and a lower surface of the second pattern layer are coplanar with each other, the first metal layer is horizontally disposed on the coplanar upper surfaces of the insulator, the at least a portion of the connection electrode, and the first pattern layer to be physically in contact with the first pattern layer and the at least a portion of the connection electrode, and the second metal layer is horizontally disposed on the coplanar lower surfaces of the insulator, at least the another portion of the connection electrode, and the first pattern layer to be physically in contact with the second pattern layer and at least the another portion of the connection electrode.

10. The substrate of claim 6, wherein the first electronic component comprises a body, a first connection electrode disposed on an upper surface of the body, and a second connection electrode disposed on a lower surface of the body, the first metal layer is physically in contact with the first pattern layer and the first connection electrode to connect the first pattern layer and the first connection electrode to each other, and the second metal layer is physically in contact with the second pattern layer and the second connection electrode to connect the second pattern layer and the second connection electrode to each other.

11. The substrate of claim 6, wherein the first electronic component comprises a body, a first connection electrode disposed on a first side surface of the body, and a second connection electrode disposed on a second side surface, an opposite side of the first side surface of the body, wherein the first metal layer is physically in contact with the first pattern layer, at least a portion of an upper side of the first connection electrode and at least a portion of an upper side of the second connection electrode to connect the first pattern layer independently with the first and second connection electrodes, and the second metal layer is physically in contact with the second pattern layer, at least a portion of a lower side of the first connection electrode and at least a portion of a lower side of the second connection electrode to connect the second pattern layer independently with the first and second connection electrodes.

12. The substrate of claim 5, further comprising a first passivation layer disposed on the upper surface of the insulating layer and an upper surface of the insulator, covering the first wiring layer and the first metal layer, and comprising a first opening exposing at least a portion of the first wiring layer; and a second passivation layer disposed on the lower surface of the insulating layer and a lower surface of the insulator, covering the second wiring layer and the second metal layer, and comprising a second opening exposing at least a portion of the second wiring layer, wherein a surface-treated layer is disposed on the exposed upper surface of the first wiring layer, and the surface-treated layer comprises a metal.

13. The substrate of claim 12, further comprising a second electronic component disposed on an upper surface of the first passivation layer;

an electric connection metal disposed on the first opening of the first passivation layer and connecting the first electronic component and the exposed first wiring layer to each other; and a molding disposed on the upper surface of the first passivation layer and covering at least a portion of the second electronic component.

14. An electronic component-embedded substrate, comprising:

an insulating layer having a through-portion covered by a first wiring layer disposed on an upper side of the insulating layer;

an electronic component disposed in the through-portion and comprising a connection electrode;

an insulator disposed in at least a portion of the through-portion between at least a portion of the electronic component and the insulating layer;

a first metal layer disposed on an upper surface of the insulator and directly connecting the first wiring layer and at least a portion of the connection electrode to each other;

a second wiring layer disposed on a lower side of the insulating layer; and a second metal layer disposed on a lower surface of the insulator and directly connecting the second wiring layer and at least another portion of the connection electrode.

15. The substrate of claim 14, wherein a thickness of the first wiring layer is greater than a thickness of the first metal layer, and a thickness of the second wiring layer is greater than a thickness of the second metal layer.

16. An electronic component-embedded substrate, comprising:

an insulating layer having a through-portion passing through the insulating layer;

an electronic component disposed in the through-portion;

an insulator disposed in a portion of the through-portion between the insulating layer and the first electronic component;

a first metal layer disposed directly on an upper surface of the insulator and an upper surface of a first electrode portion of the electronic component; and a second metal layer disposed directly on a lower surface of the insulator and a lower surface of a second electrode portion of the electronic component, wherein the insulating layer is disposed between the first and second metal layers, and the electronic component includes a connection electrode including the first and second electrode portions connected to each other by a connection portion of the connection electrode disposed on a side surface of a body of the electronic component.

17. The substrate of claim 16, wherein the upper surface of the insulator and the upper surface of the first electrode portion are coplanar with each other, and the lower surface of the insulator and the lower surface of the second electrode portion are coplanar with each other.

* * * * *